(12) United States Patent
Meid

(10) Patent No.: US 7,990,131 B2
(45) Date of Patent: Aug. 2, 2011

(54) DEVICE AND METHOD FOR MEASURING A FIRST VOLTAGE AND A SECOND VOLTAGE BY MEANS OF A DIFFERENTIAL VOLTMETER

(75) Inventor: Wolfgang Meid, Mülheim-Kärlich (DE)

(73) Assignee: Moeller GmbH, Bonn (DE)

( * ) Notice: Subject to any disclaimer, the term of this patent is extended or adjusted under 35 U.S.C. 154(b) by 97 days.

(21) Appl. No.: 12/225,042

(22) PCT Filed: Mar. 12, 2007

(86) PCT No.: PCT/EP2007/052287
§ 371 (c)(1),
(2), (4) Date: Sep. 11, 2008

(87) PCT Pub. No.: WO2007/104735
PCT Pub. Date: Sep. 20, 2007

(65) Prior Publication Data
US 2009/0115398 A1    May 7, 2009

(30) Foreign Application Priority Data
Mar. 14, 2006    (DE) .................. 10 2006 011 715

(51) Int. Cl.
*G01R 15/00*    (2006.01)
(52) U.S. Cl. ....................................................... 324/115
(58) Field of Classification Search .................. None
See application file for complete search history.

(56) References Cited

U.S. PATENT DOCUMENTS

| | | | | |
|---|---|---|---|---|
| 5,291,124 A | * | 3/1994 | Hoffman et al. | 324/72.5 |
| 5,473,244 A | * | 12/1995 | Libove et al. | 324/126 |
| 5,579,194 A | | 11/1996 | Mackenzie | |
| 6,236,215 B1 | * | 5/2001 | Kanehira | 324/429 |
| 7,466,137 B2 | * | 12/2008 | Ariyoshi | 324/426 |
| 7,622,893 B2 | * | 11/2009 | Williams | 320/112 |
| 2005/0206364 A1 | * | 9/2005 | Ishikawa et al. | 324/103 P |
| 2008/0231257 A1 | * | 9/2008 | Williams | 324/127 |
| 2009/0027814 A1 | * | 1/2009 | Meid | 361/31 |

FOREIGN PATENT DOCUMENTS

| | | |
|---|---|---|
| EP | 0098321 | 1/1984 |
| EP | 1130405 | 9/2001 |
| EP | 1384652 | 1/2004 |
| JP | 9281199 | 10/1997 |

\* cited by examiner

*Primary Examiner* — Jermele M Hollington
(74) *Attorney, Agent, or Firm* — Alfred A. Fressola; Ware, Fressola, Van Der Sluys & Adolphson LLP

(57) ABSTRACT

The invention relates to a method and a device for measuring a first voltage and a second voltage by means of a differential voltmeter. The differential voltmeter comprises a first inlet and a second inlet and a known voltage potential is applied to the second inlet. The voltage measurement comprises the following; a first voltage is applied to a first inlet of the differential voltmeter, a first differential voltage is measured, the first voltage from the measured first differential voltmeter and the known voltage potential is determined, the second voltage is applied to the second inlet of the differential voltmeter, a second differential voltage is measured, and the second voltage from the measured second differential voltage and the previously determined first voltage is determined.

25 Claims, 4 Drawing Sheets

DEVICE AND METHOD FOR MEASURING A FIRST VOLTAGE AND A SECOND VOLTAGE BY MEANS OF A DIFFERENTIAL VOLTMETER

CROSS REFERENCE TO RELATED APPLICATIONS

This application is the U.S. National Stage of International Application Number PCT/EP2007/052287 filed on Mar. 12, 2007 which was published on Sep. 20, 2007 under publication WO 2007/104735.

The present invention relates to a device and a method for measuring a first voltage and a second voltage with a differential voltmeter, the differential voltmeter comprising a first input and a second input, and a known voltage potential being present at the second input, voltage measurement comprising the following steps: applying the first voltage to a first input of the differential voltmeter; measuring a first differential voltage; determining the first voltage from the measured first differential voltage and the known voltage potential; applying the second voltage to the second input of the differential voltmeter; measuring a second differential voltage; and determining the second voltage from the measured second differential voltage and the previously determined first voltage.

BACKGROUND OF THE INVENTION

In many devices it is necessary to measure two or more voltages. This measurement of two or more voltages may be effected for example by a microcontroller, which comprises a voltmeter for each voltage to be measured.

Thus, for example, when providing an electronic motor protecting switch for a three-phase electric motor, the three phase currents of the motor must be detected, for which purpose three independent voltmeters may be used in one microcontroller. For each further voltage to be detected, a further voltmeter would be needed in the microcontroller. However, microcontrollers with more than three voltmeters are more cost-intensive and are structurally larger than microcontrollers with only three voltmeters.

SUMMARY OF THE INVENTION

The object of the invention is consequently to develop a method and a device for voltage measurement to the effect that measurement of a first voltage and measurement of a second voltage may be performed with just one voltmeter.

This object is achieved with a method of the above-mentioned type for measuring a first voltage and a second voltage with a differential voltmeter, the differential voltmeter comprising a first input and a second input, and a known voltage potential being present at the second input, the method comprising the following steps: applying the first voltage to a first input of the differential voltmeter; measuring a first differential voltage; determining the first voltage from the measured first differential voltage and the known voltage potential; applying the second voltage to the second input of the differential voltmeter; measuring a second differential voltage; and determining the second voltage from the measured second differential voltage and the previously determined first voltage.

The differential voltmeter may be so designed that it either measures the difference between the voltage at the second input and the voltage at the first input, or conversely the difference between the voltage at the first input and the voltage at the second input. It is assumed below, without being limiting, that the differential voltmeter measures the difference between the voltage at the second input and the voltage at the first input, i.e. the first input is the negative input of the differential voltmeter and the second input is the positive input of the differential voltmeter.

If the first measured differential voltage is $U_{D,1}$ and the known voltage potential is $U_B$, the first voltage may be determined as follows from the first measured differential voltage $U_{D,1}$ and the known voltage potential $U_B$:

$$U_1 = U_B - U_{D,1}$$

On the basis of the first determined voltage $U_1$ and the second measured differential voltage $U_{D,2}$, it is possible with $U_2 = U_{D,2} - U_1$ to determine the second voltage $U_2$.

This measurement method has the advantage that two voltages i.e. the first voltage and the second voltage, may be measured with just one differential voltmeter.

The known voltage potential $U_B$ may for example be ground, i.e. $U_B=0$, such that the amount of the measured first differential voltage corresponds to the amount of the first voltage to be measured and consequently the step of determining the first voltage from the measured first differential voltage and the known voltage potential no longer has to be performed or is greatly simplified, since no subtraction or addition is necessary. This may be advantageous particularly when the first voltage is negative, since the first measured differential voltage then comprises a positive sign and corresponds to the amount of the first voltage.

It is thus possible, using the measurement method according to the invention, to measure a negative first voltage in a simple manner, whereas, when using A-D converters without a differential input for voltage measurement, the negative voltage to be measured would have to be converted prior to measurement into a positive voltage using a complex operational amplifier circuit.

In addition, the sequence of steps in the method of voltage measurement according to the invention is also interchangeable. Thus, for example, first of all the second voltage may be applied to the second input of the differential voltmeter, then the second differential voltage may be measured, the known voltage potential only then being applied to the second input of the differential voltmeter and the first differential voltage being measured.

Moreover, it is also possible, for example, for the first differential voltage and the second differential voltage to be measured first of all, the first and second voltages to be measured only then being determined.

The method according to the invention for measuring the first voltage and the second voltage may be performed for example on a microcontroller, or indeed for example on a digital signal processor, or indeed in the form of software on a computer.

The differential voltmeter may be either analogue or digital. For example, the differential voltmeter may take the form of a Sigma Delta A-D converter.

A further advantage of the measurement method according to the invention is that the measurement range of the differential voltmeter may be very largely utilised.

In one development of the invention, after measurement of the second differential voltage a check is carried out as to whether the second differential voltage exceeds a predetermined limit value, and the measurement method starts again from the beginning if the predetermined limit value is exceeded, the measurement method being repeated until the second measured differential voltage does not exceed the predetermined limit value, the second voltage only then being determined from the measured second differential voltage and the previously determined first voltage.

By means of this check as to whether the measured second differential voltage exceeds a predetermined limit value, it is possible, for example, to identify whether the second measured differential voltage lies within the permissible measurement range of the differential voltmeter, wherein the limit value has then to be selected as a function of the maximum measurement range to be detected by the differential voltmeter. If the limit value is exceeded, i.e. if the measured second differential voltage lies outside the permissible measurement range, the entire voltage measurement is repeated, i.e. first of all the known voltage potential is applied to the second input of the differential voltmeter and the first differential voltage is measured and then the second voltage is applied to the second input of the differential voltmeter and the second differential voltage is measured. The measuring process is repeated until the second measured differential voltage no longer exceeds the predetermined limit value. Only then does determination of the second voltage from the measured second differential voltage and the previously determined first voltage take place.

Moreover, in addition to this check as to whether the second measured differential voltage exceeds a predetermined limit value, a check may also be performed as early as after measurement of the first differential voltage as to whether the first measured differential voltage exceeds a predetermined limit value, the measuring process being started again if it does. Thus, the measuring process may be directly repeated if even the first measured differential voltage lies outside the permissible measurement range of the differential voltmeter.

In one development of the invention, a switch unit is connected to the second input of the differential voltmeter, in such a way that, in a first state, the switch unit switches the known voltage potential to the second input of the differential voltmeter and that, in a second state, the switch unit switches the second voltage to the second input of the differential voltmeter; the switch unit being activated into the first state for measurement of the first differential voltage, and the switch unit then being activated into the second state for measurement of the second differential voltage.

This switch unit may for example take the form of at least one relay and/or at least one transistor.

In one development of the invention, the differential voltmeter is arranged in a microcontroller, the measurement method being performed by the microcontroller and in particular the switch unit being controlled by the microcontroller.

The microcontroller may thus read out directly the measured first differential voltage and the measured second differential voltage from the differential voltmeter and perform the processing steps of the measurement method according to the invention. In this respect, the microcontroller firstly controls the switch unit into the first state, reads out the measured first differential voltage from the differential voltmeter and calculates the first voltage from the measured first differential voltage and the known voltage potential. Then, the microcontroller switches the switch unit into the second state and reads out the measured second differential voltage from the differential voltmeter and then calculates the second voltage from the measured second differential voltage and the already determined first voltage. The microcontroller may put the first voltage and second voltage determined in this way to internal use for further processing and/or output them at an output.

In addition, the microcontroller may also perform the above-described check as to whether the second measured voltage exceeds the limit value, and if the predetermined limit value is exceeded it may restart the measuring process, until the second measured voltage does not exceed the limit value. Moreover, the microcontroller may also be used for the above-described checking as to whether the first measured voltage exceeds the limit value and for the possibly resultant restarting of the measuring process.

In one development of the invention, the differential voltmeter is a Sigma Delta A-D converter.

In one development of the invention, the switch unit comprises a transistor.

The transistor may, for example, take the form of a field effect transistor, wherein either a junction-gate FET, a depletion MOSFET or an enhancement MOSFET may be used. The field effect transistor may take the form either of an N-channel or a P-channel type. In addition, a bipolar transistor may also be used for the switch unit, which may be either an NPN or a PNP type. Furthermore, the switch unit may also comprise more than one transistor.

The above-mentioned object of the invention is achieved by a device for measuring a first voltage and a second voltage comprising a switch unit and a microcontroller, which includes a differential voltmeter; the first voltage being present at a first input of the differential voltmeter; and a switch unit being connected to the second input of the differential voltmeter in such a way that, in a first state, the switch unit switches a known voltage potential to the second input of the differential voltmeter and that, in a second state, the switch unit switches the second voltage to the second input of the differential voltmeter; the microcontroller performing the following steps: activating the switch unit into the first state; inputting a first differential voltage measured by the differential voltmeter; determining the first voltage from the measured first differential voltage and the known voltage potential; activating the switch unit into the second state; inputting a second differential voltage measured by the differential voltmeter; and determining the second voltage from the measured second differential voltage and the previously determined first voltage.

The above explanations of the method of measuring a first voltage and a second voltage apply equally to this device according to the invention for measuring a first voltage and a second voltage. The microcontroller here assumes control of the measurement and determines the first voltage and the second voltage.

In one development of the invention, after measurement of the second differential voltage the microcontroller checks whether the second differential voltage exceeds a predetermined limit value, and the microcontroller starts measurement again from the beginning if the predetermined limit value is exceeded, the microcontroller repeating measurement until the second differential voltage does not exceed the predetermined limit value, the microcontroller only then determining the second voltage from the measured second differential voltage and the previously determined first voltage.

For this embodiment regarding checking of whether the measured differential voltage exceeds a limit value, the modifications to this embodiment described above in relation to performing the method apply analogously.

In one development of the invention, the first input of the differential voltmeter is the negative input of the differential voltmeter, and the second input of the differential voltmeter is the positive input of the differential voltmeter.

Thus, the differential voltmeter measures the difference between the second voltage and the first voltage.

This development of the invention is particularly advantageous when the first voltage to be measured is negative and the known voltage potential is ground, since the first measured differential voltage then corresponds directly to the amount of the negative first voltage. Thus, complex converter circuits, which would have had to have taken the form for example of operational amplifiers, may be omitted for measurement of the negative first voltage.

In one development of the invention, a decoupling element is disposed between the switch unit and the second input of the differential voltmeter.

This decoupling element serves to decouple the second input of the differential voltmeter from the switch unit. This decoupling element may take the form of a resistor, for example.

In one development of the invention, the microcontroller comprises at least one further voltmeter.

Thus, in addition to the first voltage and the second voltage, at least one further voltage may be measured, and the microcontroller may use this one further voltage for example for further processing. This at least one further voltmeter may take the form, for example, of an A-D converter with just one input, or of a differential voltmeter, which may for example constitute a Sigma Delta A-D converter. A-D converters which comprise one input may also be combined with Sigma Delta A-D converters.

In one development of the invention, the first voltage is present at an output of a first detection unit, and this detection unit serves to detect a first current, which is supplied to an electric motor, such that the voltage present at the output of the first detection unit depends on the detected first current; this output additionally being connected to the first input of the differential voltmeter.

The electric motor may be either a d.c. motor or an a.c. motor, wherein the a.c. motor may be a single-phase a.c. motor or a multi-phase a.c. motor.

If the electric motor takes the form for example of a d.c. motor, and if the supplied first current is thus also a direct current, the first detection unit may for example be a resistor, which is disposed in the current supply line to the motor, such that the first current flows through the resistor and the voltage dropping at the resistor is present at the output of the first detection unit; in addition, the first detection unit may for example take the form of a magnetic field transducer, such that a voltage proportional to the measured magnetic field and thus to the first current is present at the output of the first detection unit, wherein this magnetic field transducer may take the form for example of a Hall effect transducer.

If the electric motor takes the form for example of an a.c. motor, the first detection unit may for example be an inductive current transducer, such as for example a transformer, through which the first current to be detected flows on the primary side and on whose secondary side the transformed first current is converted into the voltage present at the output of the first detection unit.

This conversion may proceed for example by means of a shunt resistor.

In one development of the invention, the second voltage is present at a capacitor, and the capacitor is connected to the switch unit, the capacitor constituting a thermal memory for previous thermal disconnections of the electric motor.

The capacitor used as a thermal memory may for example simulate the heating of the electric motor during normal operation and during an overload phase by means of the voltage present at the capacitor. In this way, for example, the thermal balance of the electric motor may be permanently stored, such that after thermal disconnection of the motor the thermal state of the motor is known. After thermal disconnection a voltage associated with the thermal state of the electric motor is thus present at the capacitor, the capacitor then being discharged according to a predefined characteristic, such that the voltage at the capacitor diminishes. Discharge may take place, for example, by means of a resistor, the capacitor and the resistor defining the predefined discharge characteristic. The microcontroller may detect the second voltage by means of the measuring device according to the invention and for example only permit restarting of the disconnected motor when the second voltage falls below a predefined level, so for example preventing the motor from being switched on again too quickly after previous thermal disconnection and thereby being damaged. In this way, the capacitor acting as a thermal memory may for example replace the bimetallic element which is used in a motor protecting switch to protect the electric motor after thermal disconnection.

In one development of the invention, an operational amplifier is disposed between the capacitor and the switch unit.

The operational amplifier may serve to ensure that the capacitor is not discharged via the switch unit.

In one development of the invention, a filter unit is disposed between the output of the first detection unit and the first input of the differential voltmeter.

This filter unit may for example have a low pass characteristic, to suppress high-frequency portions of the voltage at the output of the detection unit and thus to increase measuring accuracy. For instance, this filter unit may take the form, for example, of a quad gate, in which in each case a capacitor is connected to ground at the input and at the output and a resistor is connected between the in- and outputs of the quad gate.

In one development of the invention, the electric motor is an a.c. motor and the first current represents a first phase current.

The electric motor may either be a single phase a.c. motor, to which precisely one phase current is then supplied, or it may be a multi-phase a.c. motor, such as for example a three-phase a.c. motor.

In one development of the invention, the first detection unit comprises the following means: a current transducer, through whose primary side the phase current to be detected flows; and a rectifier, which is connected to the secondary-side output of the current transducer for rectifying the transformed phase current; and a resistor, which is connected between the rectifier and a ground point in such a way that the transformed and rectified phase current flows through the resistor and a voltage drops over the resistor, and this voltage is present at the output of the detection unit.

The current transducer may for example be adjustable to different nominal current ranges, such that a constant, transformed current range arises on the secondary side irrespective of the absolute nominal current range of the particular electric motor. Adjustment of the current transducer to the particular nominal current range as a function of the electric motor may be achieved, for example, by the winding ratio between the primary and secondary sides.

The rectifier may take the form, for example, of a one-way rectifier, or indeed of a multiway rectifier.

The resistor may additionally be connected to the rectifier in such a way that a negative voltage drops towards ground over the first resistor.

In one development of the invention, the rectifier is a bridge rectifier, and a second output of the bridge rectifier generates the supply voltage.

In one development of the invention, at least one further phase current is supplied to the electric motor, and in each case a further detection unit and in each case a voltmeter arranged in the microcontroller is associated with each one of the at least one further phase currents, each one of these at least one further detection units corresponding to the first detection unit, such that a voltage is present in each case at the output of said at least one further detection units which is dependent on the in each case associated and detected phase current; each output of said at least one further detection units additionally being connected to a first input of the in each case associated voltmeter.

According to this development of the invention, the electric motor is a multi-phase a.c. motor, such as for example a three-phase a.c. motor. Each individual one of the phase currents supplied to the motor is detected by a separate detection unit, which corresponds in structure to the previously described first detection unit. Thus, any previously described developments of the first detection unit also apply to each one of the at least one further detection units. Thus, each of the phase currents supplied to the electric motor may be detected by the in each case associated detection unit, each of these detection units supplying the output voltage corresponding to the detected phase current to the microcontroller for voltage measurement. To this end, the microcontroller has at least one further voltmeter in addition to the differential voltmeter. This at least one further voltmeter may take the form of an A-D converter with one input; however this at least one further voltmeter may also take the form of a differential voltmeter, such as for example a Sigma Delta A-D converter. If such a differential voltmeter is used for the at least one further voltmeter, the first input of the differential voltmeter, at which the output voltage of the associated detection unit is present, may be the negative input of the differential voltmeter, while the positive input of the differential voltmeter is connected to ground, wherein a resistor may be connected between this positive input and the ground.

In one development of the invention, a filter unit is disposed between at least one output of the at least one further detection unit and the first input of the in each case associated voltmeter.

The above-described developments of the filter unit between the first detection unit and the associated differential voltmeter apply to this filter unit.

In one development of the invention, at least one of the at least one further voltmeters is a Sigma Delta A-D converter, and a second input of this at least one Sigma Delta A-D converter is connected to ground, the first input of the at least one Sigma A-D converter being the negative input, and the second input of the at least one Sigma Delta A-D converter being the positive input. A resistor may be connected between the positive input of this at least one Sigma Delta A-D converter and ground.

In one development of the invention, the microcontroller and the at least one detection unit are arranged in a motor protecting switch.

The motor protecting switch serves to protect an electric motor, for example from overload, the microcontroller being used to monitor at least one current supplied to the electric motor, this at least one current supplied to the electric motor being detected by the at least one detection unit. Each one of the at least one detection units outputs a voltage proportional to the current detected in each case, which voltage is detected by in each case one voltmeter within the microcontroller. On the basis of the at least one detected voltage, the microcontroller can check whether the at least one current supplied to the electric motor exceeds a predetermined limit value and then effect overload disconnection of the electric motor.

Thus, the method according to the invention and the device for measuring a first voltage and a second voltage may be used to provide an electronic motor protecting switch. In a three-phase a.c. motor, it is possible, for example with a microcontroller which has three differential voltmeters, to detect each one of the three phase currents supplied to the motor with in each case one differential voltmeter, and in addition it is possible by means of the present invention, with one of the three differential voltmeters, in parallel also to detect a second voltage, which is present for example at the capacitor acting as a thermal memory. Thus, the microcontroller may detect four voltages with only three differential voltmeters, thereby making possible an inexpensive embodiment of the electronic motor protecting switch.

In one development of the invention, the known voltage potential is ground.

BRIEF DESCRIPTION OF THE DRAWINGS

The invention is explained in more detail below with reference to drawings, which show two exemplary embodiments.

In the Figures.

DETAILED DESCRIPTION

Figure 1:
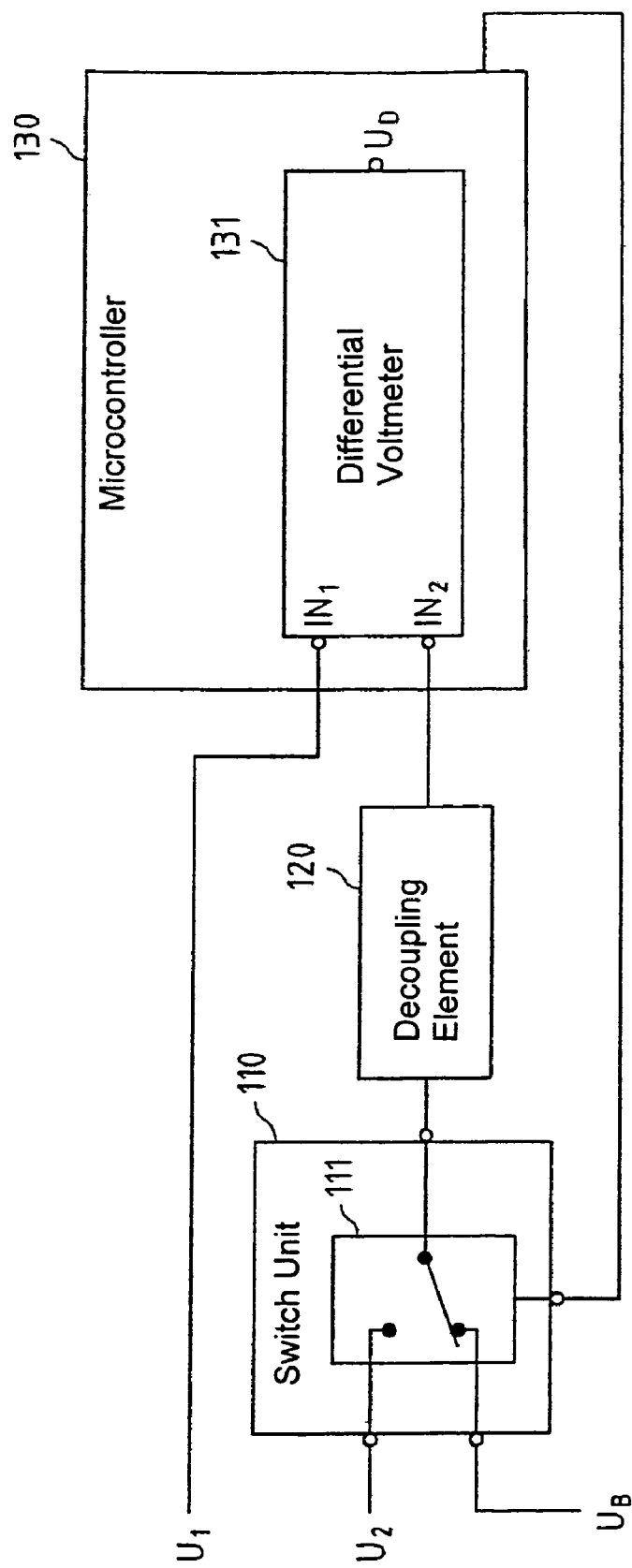
FIG. 1 shows an embodiment of a device according to the invention for measuring a first voltage and a second voltage.

The block diagram shown in FIG. 1 shows an exemplary embodiment of a device for measuring a first voltage $U_1$ and a second voltage $U_2$. The voltage measurement according to the invention is explained below with reference to the flow chart shown in FIG. 2, in which the steps of the measurement method according to the invention are illustrated. The method steps illustrated in FIG. 2 may be performed for example on a microcontroller, but also for example on a DSP.

The device illustrated in FIG. 1 comprises a microcontroller 130, which includes a differential voltmeter 131 with a first input $IN_1$ and a second input $IN_2$. The first voltage $U_1$ to be measured is present at the first input $IN_1$ of differential voltmeter 131. The second input $IN_2$ of the differential voltmeter 131 is connected to a switch unit 110 via a decoupling element 120. By means of a switch element 111, which may for example take the form of a relay or a transistor, the switch unit either switches the second voltage $U_2$ to be measured to the second input of the differential voltmeter 131 or a known voltage $U_B$ to the second input of the differential voltmeter 131. The switch unit 110 is additionally connected via a control line to the microcontroller 130, such that the microcontroller may, with the assistance of the switch unit, switch either the voltage $U_2$ to be measured or the known voltage $U_B$ to the second input $IN_2$ of the differential voltmeter 131.

It is assumed below, without being limiting, that the first input $IN_1$ of the differential voltmeter 131 is the negative input and that the second input $IN_2$ of the differential voltmeter is the positive input.

At the start of voltage measurement, the microcontroller 130 activates the switch unit 110 in such a way that the known voltage potential $U_B$ is applied to the second input of the differential voltmeter. This corresponds to step 210 of the method illustrated in FIG. 2. The differential voltmeter then measures a first differential voltage $U_{D,1}=U_B-U_1$ according to step 211. From this first differential voltage the microcontroller is able to determine the voltage $U_1$ according to step 212 as follows: $U_1 = U_B - U_{D,1}$.

It may be particularly advantageous to set the known voltage $U_B$ to ground potential, i.e. $U_B = 0V$, since in this way the microcontroller may determine the voltage $U_1$ to be measured directly from the measured first differential voltage $U_{D,1}$ without any calculation.

Then the microcontroller activates the switch unit 110 in such a way that the second voltage $U_2$ is applied to the second input of the differential voltmeter. This corresponds to step 213 of the flow chart illustrated in FIG. 2. The differential voltmeter 131 then measures a second differential voltage $U_{D,2} = U_2 - U_1$ corresponding to step 214.

The microcontroller 130 may then check, for example in step 215, whether the second measured differential voltage $U_{D,2}$ lies above a limit value $U_1$. This check may be used for example to check whether the second measured differential voltage $U_{D,2}$ lies in the permissible measurement range of the differential voltmeter 131. If, in step 215, the microcontroller recognises voltage overrange for example, the voltage measurement method starts again at step 210. Repetition of measurement proceeds until no voltage overrange is identified in step 215. It is thus possible to prevent the measurement from being distorted due to the permissible range of the differential voltmeter 131 being exceeded.

If no voltage overrange is present in step 215, the microcontroller 130 determines the second voltage from the previously determined first voltage $U_1$ and the measured second differential voltage $U_{D,2}$ as follows: $U_2 = U_{D,2} - U_1$.

Figure 2:
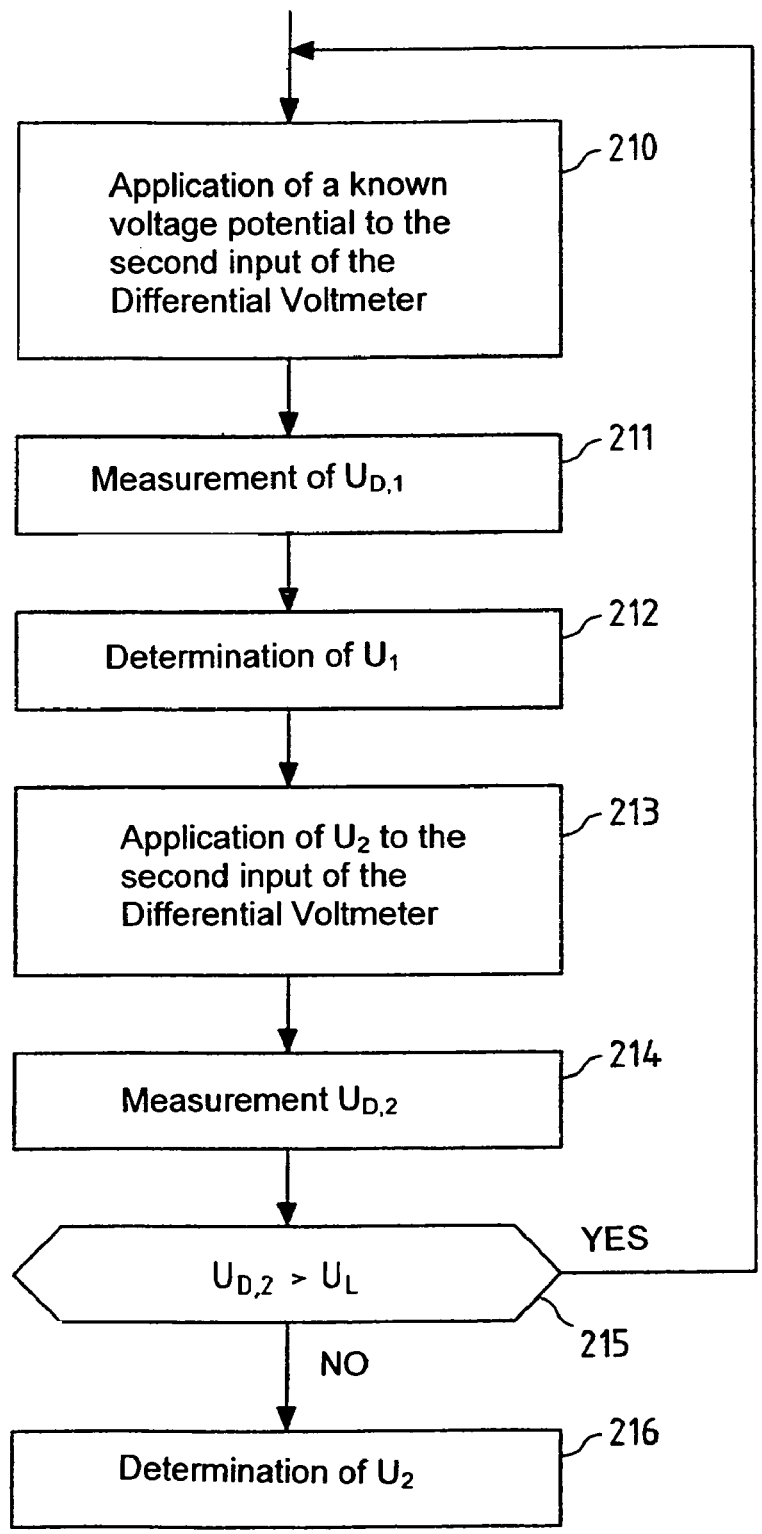
FIG. 2 shows a flow chart of a method according to the invention for measuring a first voltage and a second voltage.

Thus, using the device according to the invention as illustrated in FIG. 1 and the method according to the invention as illustrated in FIG. 2, two voltages may be measured with just one differential voltmeter 131. In addition, this measurement according to the invention makes it possible to utilise the entire measurement range of the differential voltmeter 131.

For example, the differential voltmeter 131 may take the form of a Sigma Delta A-D converter. The decoupling element 120 serves to decouple the switch unit 110 from the second input of the differential voltmeter 131, and may for example take the form of a resistor. However, the decoupling element 120 may also be omitted.

Figure 3:
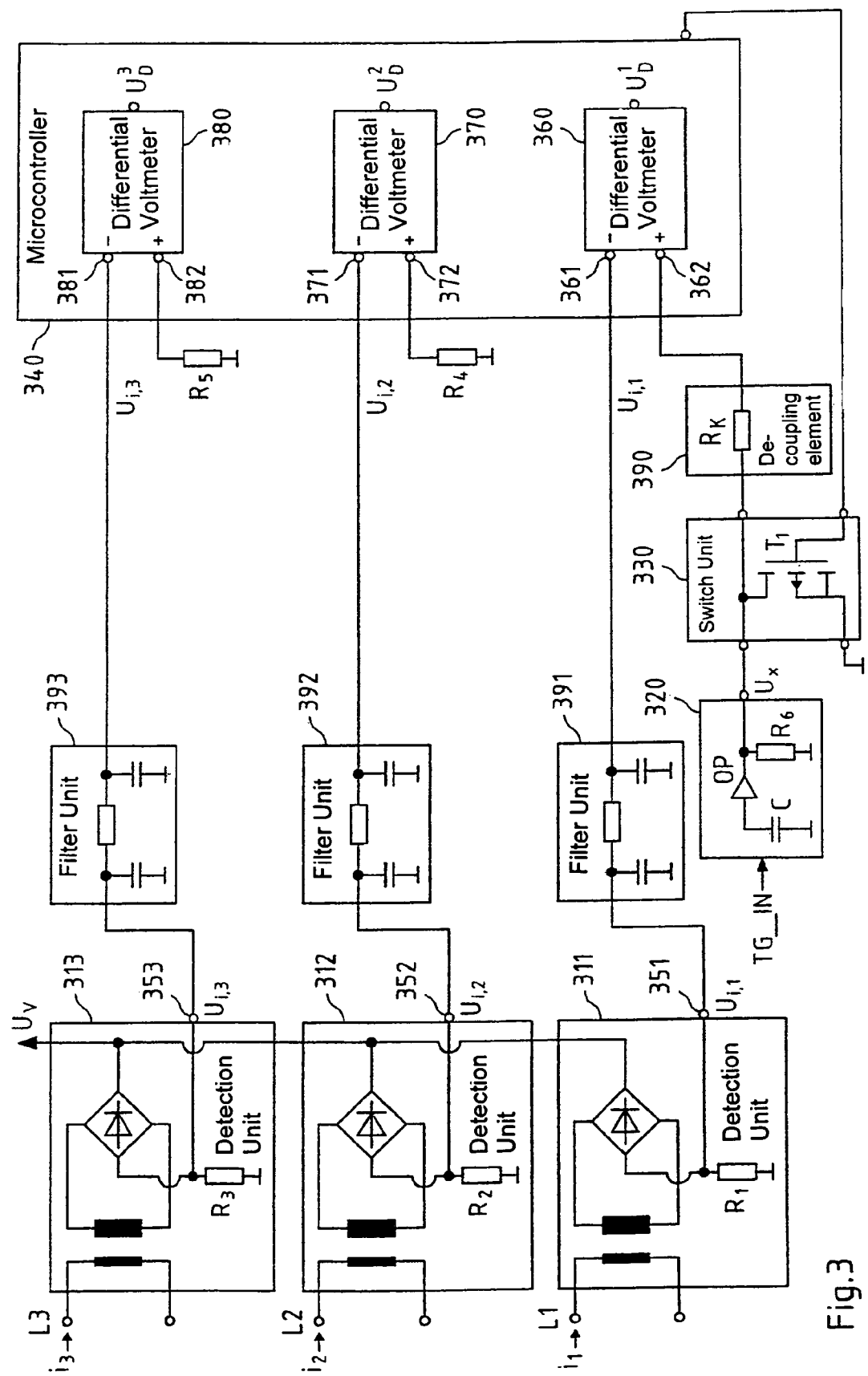
FIG. 3 shows a further embodiment of a device according to the invention for measuring a first voltage and a second voltage.

The block diagram shown in FIG. 3 shows a further exemplary embodiment of the present invention for detecting three phase currents $i_1$, $i_2$, $i_3$, which are supplied to a three-phase electric motor, by means of a microcontroller 340. The arrangement shown in FIG. 3 may be arranged in a motor protecting switch, for example, and may there monitor the currents supplied to the motor, such that the microcontroller 340 may for example detect an overload or a short-circuit current of the three phase currents $i_1$, $i_2$, $i_3$ by means of evaluators and then perform disconnection of the motor.

In addition, the microcontroller 340 detects a further voltage $U_x$, which drops over the capacitor C and is present at the output of the thermal memory unit 320. The voltage $U_x$ is here a measure of the thermal loading of the electric motor, i.e. the capacitor C acts as a thermal memory for the electric motor. The thermal memory unit 320 and thus the capacitor is actuated in such a way, for example by the signal TG_IN, that, after disconnection of the electric motor, which may take place for example due to an overload detected by microcontroller 340, the capacitor C discharges, such that the reducing voltage $U_x$ corresponds to cooling of the electric motor. This discharge may take place via a resistor (not shown in FIG. 3). In addition, between the capacitor C and the output of the thermal memory unit 320 there is located an operational amplifier OP, which prevents the capacitor C from discharging via the switch unit, for example. The capacitor voltage is thus applied to the output of the thermal memory unit 320 by means of the operational amplifier OP and the resistor $R_6$. The microcontroller 340 detects the voltage $U_x$ with the assistance of the measuring device according to the invention and may for example only permit renewed switching on of the motor after disconnection of said motor when the voltage $U_x$ has fallen below a predefined level and the electric motor has thus cooled down sufficiently. This prevents the electric motor from becoming thermally overloaded after overload tripping by being switched on again too rapidly. At the same time, preheating of the electric motor is taken into account by the thermal memory upon occurrence of an overload. Thus, the capacitor C, acting as a thermal memory, together with the microcontroller 340 may simulate the reverse bending process of a bimetallic element in a motor protecting switch. Thus, no bimetallic elements are needed in the tripping unit according to the invention.

The first detection unit 311 detects the first positive current $i_1$ supplied to the electric motor, such that a negative voltage $U_{i,1}$ is present at the output 351 of the detection unit 311, which negative voltage is dependent on the detected current $i_1$. Provided the current transducer contained in the first detection unit 311 does not go into saturation, the voltage $U_{i,1}$ is proportional to the detected current $i_1$. The current transducer used in the first detection unit 311 comprises only a small number of turns on the primary side, i.e. on the side through which the current $i_1$ flows, while the number of turns on the secondary side is significantly higher. Thus, a higher current $i_1$ on the primary side may be transformed into a smaller current on the secondary side. The winding number ratio may preferably be selected such that, irrespective of the particular current range to be detected on the primary side, which depends on the electric motor used in each case and the nominal current of said electric motor, a constant current range is obtained on the secondary side. Thus, for the purpose of current detection, the circuit on the secondary side does not have to be redimensioned for each different current range to be detected on the primary side. As FIG. 3 shows, the first detection unit 311 comprises a bridge rectifier, through which the transformed current $i_1$ flows. One output of the bridge rectifier generates a supply voltage $U_{V,1}$, while another output of the bridge rectifier is connected to ground via a resistor $R_1$. Thus, the transformed and rectified current $i_1$ flows through the resistor $R_4$, such that the negative voltage $U_{i,1}$ drops towards ground over the resistor $R_4$, and this negative voltage $U_{i,1}$ is present at the output 351 of the first detection unit 311.

In a similar manner to the first detection unit 311, the second detection unit 312 detects the second phase current $i_2$, such that the negative voltage $U_{i,2}$ dependent on $i_2$ is present at the output of the second detection unit 312; and the third detection unit 313 detects the third phase current $i_3$, such that the negative voltage $U_{i,3}$ dependent on $i_3$ is present at the output of the third detection unit 313. The second detection unit 312 and the third detection unit 313 correspond, as far as the structure is concerned, to the previously described first detection unit 311.

These three output negative voltages $U_{i,1}$, $U_{i,2}$, $U_{i,3}$ thus constitute measured variables for the phase currents $i_1$, $i_2$, $i_3$ supplied to the motor.

The microcontroller 340 comprises three differential voltmeters 360, 370, 380, wherein these differential voltmeters 360, 370, 380 may for example in each case take the form of a Sigma Delta A-D converter.

The output of the first detection unit 351 is connected to the negative input 361 of the first differential voltmeter 360, such that the negative voltage $U_{i,1}$ is present at the negative input 361 of the first differential voltmeter 360. In addition, the positive input 362 of the first differential voltmeter 360 is connected to the switch unit via the decoupling element 390, which in this example takes the form of the resistor $R_k$.

The switch unit comprises the transistor $T_1$, wherein the transistor $T_1$ is conductive in a first state and in this case conducts the ground potential via the decoupling element 390 to the positive input 362 of the first differential voltmeter 360. In a second state the transistor $T_1$ is not conductive, such that the voltage $U_x$ is switched via the decoupling element 390 to the positive input 362 of the first differential voltmeter 360. The transistor $T_1$ is connected via a control line to the microcontroller 340, such that the microcontroller 340 may activate the transistor $T_1$ via this control line either into the first or into the second state, whereby either the ground potential or the voltage $U_x$ is applied to the positive input 362 of the first differential voltmeter 360.

Using the measurement method according to the invention, the first differential voltmeter 360 may measure both the first voltage $U_{i,1}$ and the second voltage $U_x$. This measurement method is explained below with reference to FIG. 2, in which a flow chart of the measurement method is illustrated, wherein the first voltage $U_{i,1}$ used in this exemplary embodiment corresponds to the voltage $U_1$ in FIG. 2, and in addition the second voltage $U_x$ corresponds to the voltage $U_2$ in FIG. 2.

The microcontroller 340 activates the transistor $T_1$ via the control line initially into the first state, such that the transistor $T_1$ is conductive and the ground potential is present at the positive input 362 of the first differential voltmeter 360. Thus, according to step 210 a known voltage potential, i.e. in this exemplary embodiment the ground potential, is present at the second input 362, i.e. the negative input, of the first differential voltmeter 360. According to step 211, the first differential voltmeter 360 then measures the first differential voltage $U_{D,1}{}^1 = 0V - U_{i,1}$. Since the known voltage potential is ground potential, the microcontroller 340 may determine the voltage $U_{i,1}$ directly from the measured first differential voltage $U_{D,1}{}^1$ as per step 212. In addition the measured first differential voltage $U_{D,1}{}^1$ is positive, because the voltage $U_{i,1}$ has a negative sign.

Thus, the negative voltage $U_{i,1}$ may be measured using simple means, while, if a microcontroller with A-D converters without differential inputs were to be used, in which the simple inputs would relate to GND, the negative voltage $U_{i,1}$ to be measured would have to be converted into a positive voltage using more complex circuitry.

In addition, the measured first differential voltage $U_{D,1}{}^1$ is proportional to the first phase current $i_1$ unless the current transducer in the first detection unit 311 goes into saturation. Thus, the microcontroller 340 may detect the first phase current $i_1$ via the measured first differential voltage $U_{D,1}{}^1$.

After determining the voltage $U_{i,1}$ the microcontroller 340 switches the transistor $T_1$ into the second state, i.e. blocks the transistor $T_1$, such that according to step 213 the voltage $U_x$ is applied to the positive input 362 of the first differential voltmeter 360. The voltage $U_{i,1}$ is additionally present at the negative input 361 of the first differential voltmeter 360. According to step 214, the first differential voltmeter 360 then measures the second differential voltage $U_{D,2}{}^1 = U_x - U_{i,1}$.

The microcontroller 340 then checks as per step 215 whether the second measured differential voltage $U_{D,2}{}^1$ exceeds a predetermined limit value $U_L$. With this test the microcontroller 340 may check whether the voltage $U_{D,2}{}^1$ lies within the permissible measurement range of the first differential voltmeter 360. The limit value $U_L$ should thus be selected as a function of the measurement range of the first differential voltmeter 360. If the second measured differential voltage $U_{D,2}{}^1$ exceeds the predetermined limit value $U_L$, the microcontroller 340 starts the entire measuring process afresh, i.e. as per step 210 the microcontroller 340 switches the transistor $T_1$ into the first state, such that the ground potential is present at the positive input of the first differential voltmeter 360 and the first differential voltage $U_{D,1}{}^1$ is measured. The steps 210 to 215 are repeated by the microcontroller 340 until the second measured differential voltage $U_{D,2}{}^1$ no longer exceeds the predetermined limit value $U_L$. If the second measured differential voltage $U_{D,2}{}^1$ does not exceed the limit value $U_{D,2}{}^1$, i.e. if the value is not outside the range of the first differential voltmeter 360, the microcontroller 340 may, as per step 216, determine the second voltage $U_x$, which is designated in the flowchart in FIG. 2 as $U_2$, as follows from the voltage $U_{i,1}$ already determined in step 212:

$$U_x = U_{D,2}{}^1 + U_{i,1}$$

Figure 4:
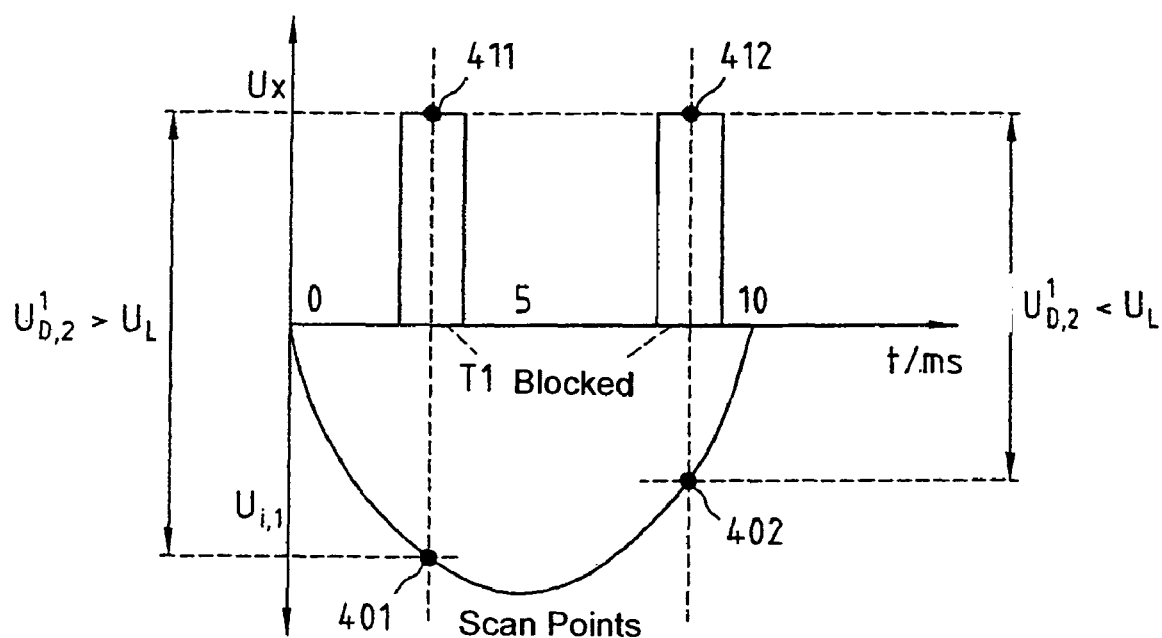
FIG. 4 shows an example of a voltage diagram for illustrating the repeated voltage measurement according to the invention in the further embodiment.

FIG. 4 shows this measurement repetition by means of an exemplary voltage diagram, which shows the voltage profile over time of the negative first voltage $U_{i,1}$ and the second voltage $U_x$. For the sake of clarity, this voltage diagram only shows the scan points 401, 411 and 402, 412 for measuring the second measured differential voltage $U_{D,2}{}^1$. During the first measurement of the second differential voltage $U_{D,2}{}^1$ by means of scan points 401 and 411, for which purpose the transistor $T_1$ is blocked by the microcontroller 340, such that the voltage $U_x$ is applied to the second input 362 of the first differential voltmeter 360, the measured second differential voltage $U_{D,2}{}^1$ is above the set limit value $U_1$, i.e. the measurement range of the first differential voltmeter 360 is exceeded. This is detected by the microcontroller 340 in step 215, and voltage measurement starts afresh at step 210 in order once again to measure the first differential voltage $U_{D,1}{}^1$ (not shown in FIG. 4). After re-measurement of the second differential voltage $U_{D,2}{}^1$ in step 214, illustrated in FIG. 4 by the scan points 402 and 412, the microcontroller 340 again checks as per step 215 whether the second differential voltage $U_{D,2}{}^1$ is exceeded. Since the second differential voltage $U_{D,2}{}^1$ measured in FIG. 4 is below the limit value $U_L$, the microcontroller 340 continues with determination of the second voltage $U_x$ (designated in step 216 as voltage $U_2$). It should additionally be noted, in relation to FIG. 4, that this Figure is not to scale, measurement of the first differential voltage $U_{D,1}{}^1$ and the subsequent second differential voltage $U_{D,2}{}^1$ taking place for example over a very short time interval, since otherwise the first voltage $U_{i,1}$ would change too much between the two measurements and thus distort the measurement.

Furthermore, the output of the second detection unit 312 is connected to the negative input 371 of the second differential voltmeter 370, and the output of the third detection unit 313 is connected to the negative input 381 of the third differential voltmeter 380. The positive input 372 of the second differential voltmeter 370 and the positive input 382 of the third differential voltmeter 380 are in each case connected to ground via a resistor $R_4$, $R_5$. Thus, the voltage $U_D{}^2 = -U_{i,2}$ measured by the second differential voltmeter 370 is directly proportional to the second phase current $i_2$, and the voltage $U_D{}^3 = -U_{i,3}$ measured by the third differential voltmeter 380 is directly proportional to the third phase current $i_3$, unless the current transducer of the second or third detection unit 312, 313 goes into saturation.

A filter unit 391 may also be disposed between the negative input 361 of the first differential voltmeter 360 and the output 351 of the first detection unit 311. This filter unit 391 may take the form, for example, of a low pass, whereby relatively high frequency portions of the voltage $U_{i,1}$ at the output of the first detection unit may be dampened and thus interference during voltage measurement may be prevented by means of the first differential voltmeter 360. This filter unit 391 may take the form, for example, of two capacitors and one resistor, as shown in FIG. 2, but other embodiments may be selected. In addition, such a filter unit 391, 392, 393 may likewise be disposed between the output of the second detection unit 312 and the negative input 371 of the second differential voltmeter 370 and between the output 313 of the third detection unit 353 and the negative input 381 of the third differential voltmeter 380.

With the measuring device according to the invention and the measurement method according to the invention it is thus possible to detect four different voltages $U_{i,1}$, $U_{i,2}$, $U_{i,3}$, $U_x$ using only three voltmeters 360, 370, 380, such that low-cost microcontrollers 340 with just three voltmeters 360, 370, 380 may be used. Thus, the present invention may be used to provide a low-cost electronic motor protecting switch.

In addition, the present invention makes it possible for the measurement range of the first differential voltmeter 360 to be very largely utilised when determining the voltages $U_{i,1}$ and $U_x$.

A further advantage of the present invention is the efficient detection of the three negative voltages $U_{i,1}$, $U_{i,2}$, $U_{i,3}$, which are in each case present at the negative input of the associated differential voltmeter 360, 370, 380 and thus may be measured directly and without complex converter circuits containing for example at least one operational amplifier, despite their negative sign.

The invention claimed is:

1. A method for measuring a first voltage relative to ground and a second voltage relative to ground with a differential voltmeter, the differential voltmeter comprising a first input and a second input, and a known voltage potential relative to ground being present at the second input, the method comprising:
applying the first voltage to the first input of the differential voltmeter;
measuring a first differential voltage between the first input and the second input;
determining the first voltage from the measured first differential voltage and the known voltage potential;
switching the second input of the differential voltmeter to apply a second voltage to the second input rather than said known voltage potential;
measuring a second differential voltage between the first input and the second input; and
determining the second voltage from the measured second differential voltage and the previously determined first voltage.

2. The method according to claim 1, wherein, after measurement of the second differential voltage, a check is carried out as to whether the second differential voltage exceeds a predetermined limit value, and the measurement method starts again from the beginning if the predetermined limit value is exceeded, the measurement method being repeated until the second measured differential voltage does not exceed the predetermined limit value, the second voltage only then being determined from the measured second differential voltage and the previously determined first voltage.

3. The method according to claim 1, wherein a switch unit is connected to the second input of the differential voltmeter, in such a way that, in a first state, the switch unit switches the known voltage potential to the second input of the differential voltmeter and that, in a second state, the switch unit switches the second voltage to the second input of the differential voltmeter;
and wherein the switch unit is activated into the first state for measurement of the first differential voltage, and the switch unit is then activated into the second state for measurement of the second differential voltage.

4. The method according to claim 3, wherein the differential voltmeter is arranged in a microcontroller and wherein the measurement method is performed by the microcontroller, and in particular the switch unit is controlled by the microcontroller.

5. The method according to claim 1, wherein the differential voltmeter is a Sigma Delta A-D converter.

6. The method according to claim 1, wherein the switch unit comprises a transistor.

7. A device for measuring a first voltage relative to ground and a second voltage relative to ground, comprising a switch unit and a microcontroller, which includes a differential voltmeter; wherein the first voltage is present at a first input of the differential voltmeter; and wherein the switch unit is connected to the second input of the differential voltmeter, in such a way that, in a first state, the switch unit switches a known voltage potential relative to ground to the second input of the differential voltmeter and that, in a second state, the switch unit switches the second voltage to the second input of the differential voltmeter; wherein the microcontroller:
activates the switch unit into the first state;
measures a first differential voltage by the differential voltmeter between the first input and the second input;
determines the first voltage from the measured first differential voltage and the known voltage potential;
activates the switch unit into the first second state;
measures a second differential voltage by the differential voltmeter between the first input and the second input; and
determines the second voltage from the measured second differential voltage and the previously determined first voltage.

8. The device according to claim 7, wherein, after measurement of the second differential voltage, the microcontroller checks whether the second differential voltage exceeds a predetermined limit value, and the microcontroller starts measurement again from the beginning if the predetermined limit value is exceeded, wherein the microcontroller repeats measurement until the second differential voltage does not exceed the predetermined limit value, the microcontroller only then determines the second voltage from the measured second differential voltage and the previously determined first voltage.

9. The device according to claim 7, wherein the differential voltmeter is a Sigma Delta A-D converter.

10. The device according to claim 7, wherein the switch unit comprises a transistor.

11. The device according to claim 7, wherein the first input of the differential voltmeter is the negative input of the differential voltmeter, and the second input of the differential voltmeter is the positive input of the differential voltmeter.

12. The device according to claim 7, wherein a decoupling element is disposed between the switch unit and the second input of the differential voltmeter.

13. The device according to claim 7, wherein the microcontroller comprises at least one further voltmeter.

14. The device according to claim 7, wherein the known voltage potential is ground.

15. The device according to claim 7, wherein the first voltage is present at an output of a first detection unit, and this detection unit serves to detect a first current, which is supplied to an electric motor, such that the voltage present at the output of the first detection unit depends on the detected first current;

and wherein this output is additionally connected to the first input of the differential voltmeter.

16. The device according to claim 15, wherein the microcontroller and the at least one detection unit are arranged in a motor protecting switch.

17. The device according to claim 15, wherein the second voltage is present at a capacitor, and the capacitor is connected to the switch unit so as to constitute a thermal memory for previous thermal disconnections of the electric motor.

18. The device according to claim 17, wherein an operational amplifier is disposed between the capacitor and the switch unit.

19. The device according to claim 15, wherein a filter unit is disposed between the output of the detection unit and the first input of the differential voltmeter.

20. The device according to claim 15, wherein the electric motor is an a.c. motor and the first current represents a first phase current.

21. The device according to claim 20, wherein the first detection unit comprises:
   a current transducer, through whose primary side the phase current to be detected flows;
   a rectifier, which is connected to the secondary-side output of the current transducer for rectifying the transformed phase current; and
   a resistor, which is connected between the rectifier and a ground point in such a way that the transformed and rectified phase current flows through the resistor and a voltage drops over the resistor, and this voltage is present at the output of the detection unit.

22. The device according to claim 21, wherein the rectifier is a bridge rectifier, and a second output of the bridge rectifier generates a supply voltage.

23. The device according to claim 18, wherein at least one further phase current is supplied to the electric motor, and in each case a further detection unit and in each case a voltmeter arranged in the microcontroller is associated with each one of the at least one further phase currents, wherein each one of these at least one further detection units corresponds to the first detection unit, such that a voltage is present in each case at the output of said at least one further detection units which is dependent on the in each case associated and detected phase current; and wherein in addition each output of said at least one further detection units is connected to a first input of the in each case associated voltmeter.

24. The device according to claim 23, wherein a filter unit is disposed between at least one output of the at least one further detection unit and the first input of the in each case associated voltmeter.

25. The device according to claim 24, wherein at least one of the at least one further voltmeters is a Sigma Delta A-D converter, and a second input of this at least one Sigma Delta A-D converter is connected to ground, and wherein the first input of the at least one Sigma A-D converter is the negative input, and the second input of the at least one Sigma Delta A-D converter is the positive input.

* * * * *